US012696392B2

(12) United States Patent
Furutani et al.

(10) Patent No.: US 12,696,392 B2
(45) Date of Patent: Jul. 28, 2026

(54) WIRING SUBSTRATE

(71) Applicant: IBIDEN CO., LTD., Gifu (JP)

(72) Inventors: Toshiki Furutani, Ogaki (JP); Kyohei Yoshikawa, Ogaki (JP); Takuya Inishi, Ogaki (JP); Jun Sakai, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 199 days.

(21) Appl. No.: 18/595,674

(22) Filed: Mar. 5, 2024

(65) Prior Publication Data

US 2024/0306299 A1 Sep. 12, 2024

(30) Foreign Application Priority Data

Mar. 6, 2023 (JP) ................................. 2023-033794

(51) Int. Cl.
| *H05K 1/11* | (2006.01) |
| *H05K 1/03* | (2006.01) |
| *H05K 3/16* | (2006.01) |
| *H05K 3/18* | (2006.01) |

(52) U.S. Cl.
CPC ........... H05K 1/116 (2013.01); H05K 1/0306 (2013.01); H05K 3/181 (2013.01); *H05K 3/16* (2013.01); *H05K 2201/032* (2013.01); *H05K 2201/09536* (2013.01)

(58) Field of Classification Search
None
See application file for complete search history.

(56) References Cited

U.S. PATENT DOCUMENTS

2024/0306296 A1* 9/2024 Furutani ................ H05K 1/115

FOREIGN PATENT DOCUMENTS

| JP | 2015-133473 A | | 7/2015 | |
| KR | 101661272 B1 | * | 9/2016 | ............... H05K 3/24 |
| WO | WO-2010093699 A1 | * | 8/2010 | ......... H10F 39/8063 |
| WO | WO-2022191180 A1 | * | 9/2022 | .......... H05K 3/4655 |
| WO | WO-2022270076 A1 | * | 12/2022 | ............. H01L 24/45 |

OTHER PUBLICATIONS

WO 2022191180 A1 Translation (Year: 2025).*
WO 2022270076 A1 Translation (Year: 2025).*
WO 2010093699 A1 Translation (Year: 2025).*
KR 101661272 B1 Translation (Year: 2025).*

* cited by examiner

*Primary Examiner* — Timothy J Thompson
*Assistant Examiner* — John B Freal
(74) *Attorney, Agent, or Firm* — Finnegan, Henderson, Farabow, Garrett & Dunner, LLP

(57) ABSTRACT

A wiring substrate includes a core substrate including a through-hole conductor, a resin insulating layer formed on the core substrate, a conductor layer formed on a surface of the resin insulating layer and including a seed layer and an electrolytic plating layer formed on the seed layer, and a via conductor formed in the resin insulating layer such that the via conductor is connected to the through-hole conductor in the core substrate and includes the seed layer and electrolytic plating layer extending from the conductor layer. The core substrate includes a glass substrate such that the through-hole conductor is formed in a through hole penetrating through the glass substrate, and the conductor layer and via conductor are formed such that the seed layer is formed by sputtering and includes an alloy including copper, aluminum, and one or more metals selected from nickel, zinc, gallium, silicon, and magnesium.

20 Claims, 6 Drawing Sheets

WIRING SUBSTRATE

CROSS-REFERENCE TO RELATED APPLICATIONS

The present application is based upon and claims the benefit of priority to Japanese Patent Application No. 2023-033794, filed Mar. 6, 2023, the entire contents of which are incorporated herein by reference.

BACKGROUND OF THE INVENTION

Field of the Invention

The present invention relates to a wiring substrate.

Description of Background Art

Japanese Patent Application Laid-Open Publication No. 2015-133473 describes a multilayer substrate having a core formed of a glass material. The entire contents of this publication are incorporated herein by reference.

SUMMARY OF THE INVENTION

According to one aspect of the present invention, a wiring substrate includes a core substrate including a through-hole conductor, a resin insulating layer formed on the core substrate, a conductor layer formed on a surface of the resin insulating layer and including a seed layer and an electrolytic plating layer formed on the seed layer, and a via conductor formed in the resin insulating layer such that the via conductor is connected to the through-hole conductor in the core substrate and includes the seed layer and electrolytic plating layer extending from the conductor layer. The core substrate includes a glass substrate such that the through-hole conductor is formed in a through hole penetrating through the glass substrate, and the conductor layer and via conductor are formed such that the seed layer is formed by sputtering and includes an alloy including copper, aluminum, and one or more metals selected from nickel, zinc, gallium, silicon, and magnesium.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figures 1, 2A:
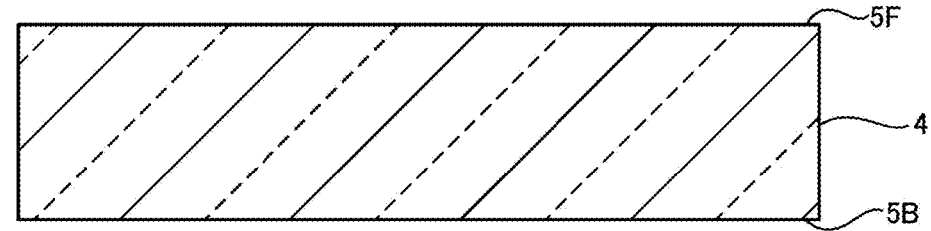
FIG. 1 is a cross-sectional view schematically illustrating a wiring substrate according to an embodiment of the present invention.
FIG. 2A is a cross-sectional view schematically illustrating a method for manufacturing a wiring substrate according to an embodiment of the present invention.

Embodiments will now be described with reference to the accompanying drawings, wherein like reference numerals designate corresponding or identical elements throughout the various drawings.

Embodiment

FIG. 1 is a cross-sectional view illustrating a wiring substrate 2 according to an embodiment of the present invention. As illustrated in FIG. 1, the wiring substrate 2 includes a core substrate 3, a front side build-up layer (300F), and a back side build-up layer (300B).

The core substrate 3 includes a substrate 4, through holes 6, and through-hole conductors 8. The substrate 4 has a front surface (5F) and a back surface (5B) on the opposite side with respect to the front surface (5F). The substrate 4 is formed of glass. The through holes 6 penetrate the substrate 4. The through holes 6 each have a substantially cylindrical shape. The through holes 6 each have a substantially constant diameter. It is also possible that the through holes 6 each have a substantially truncated cone shape. It is also possible that the through holes 6 each have a shape obtained by connecting two substantially conical shapes. The two cones are a front surface side cone and a back surface side cone. A bottom surface of the front surface side cone is positioned on the front surface (5F), and a bottom surface of the back surface side cone is positioned on the back surface (5B). In this case, a side surface of each of the through holes 6 is formed of a surface tapering from the front surface (5F) toward the back surface (5B) and a surface tapering from the back surface (5B) toward the front surface (5F).

The through-hole conductors 8 are respectively formed in the through holes 6. The through-hole conductors 8 are mainly formed of copper. The through-hole conductors 8 include a seed layer (10a) formed on inner wall surfaces of the through holes 6 and an electrolytic plating layer (10b) formed on the seed layer (10a). The electrolytic plating layer (10*b*) fills the through holes 6. The seed layer (10*a*) is formed by electroless plating. The through-hole conductors 8 each have an upper end (8F) and a lower end (8B). A surface of the upper end (8F) and the front surface (5F) form substantially the same flat surface. A surface of the lower end (8B) and the back surface (5B) form substantially the same flat surface. The upper end (8F) is exposed from the front surface (5F). The lower end (8B) is exposed from the back surface (5B).

The front side build-up layer (300F) is formed on the front surface (5F) of the substrate 4. The front side build-up layer (300F) includes front side resin insulating layers, front side conductor layers, and front side via conductors that penetrate the front side resin insulating layers. The front side conductor layers and the front side via conductors are electrically connected to the through-hole conductors 8. The front side resin insulating layers and the front side conductor layers are alternately laminated. The front side resin insulating layers in FIG. 1 are a first resin insulating layer (20F) and a second resin insulating layer (120F). The front side conductor layers are a first conductor layer (30F) and a second conductor layer (130F). The front side via conductors are first via conductors (40F) and second via conductors (140F).

The first resin insulating layer (20F) has a first surface (22F) and a second surface (24F) on the opposite side with respect to the first surface (22F). The first resin insulating layer (20F) is formed on the front surface (5F) of the substrate 4 with the second surface (24F) facing the front surface (5F). In the example of FIG. 1, the second surface (24F) is in contact with the front surface (5F). The second surface (24F) is in contact with a part of the upper end (8F). No conductor circuit exists between the front surface (5F) and the second surface (24F). No conductor circuit is formed on the front surface (5F). The first resin insulating layer (20F) has first openings (26F) that respectively reach the upper ends (8F) of the through-hole conductors 8. The first openings (26F) each have an opening (top opening) on the first surface (22F) and an opening (bottom opening) on the second surface (24F). The top opening and the bottom opening each have a substantially circular shape. The bottom opening can expose the upper end (8F) and the front surface (5F) at the same time. In this case, the front surface (5F) around the upper end (8F) is exposed. It is also possible that the bottom opening exposes a part of the upper end (8F) and the front surface (5F) around the part (first example). It is also possible that the bottom opening exposes the entire upper end (8F) and the front surface (5F) around the upper end (8F) (second example). As illustrated in FIG. 1, the bottom opening can expose only the upper end (8F) (third example). Two examples among the first example, the second example and the third example may be mixed. All of the first example, the second example and the third example may be mixed. It is preferable that the first example and the third example are mixed. In this case, the upper ends (8F) of some of the through-hole conductors 8 are exposed by the openings of the first example, and the upper ends (8F) of the remaining through-hole conductors are exposed by the openings of the third example. The first resin insulating layer (20F) is formed of a resin and a large number of inorganic particles dispersed in the resin. The resin is an epoxy resin. Examples of the resin include a thermosetting resin and a photocurable resin. The inorganic particles are glass particles. It is also possible that the inorganic particles are alumina particles. A content of the inorganic particles in the first resin insulating layer (20F) is 75 wt % or more.

The first surface (22F) of the first resin insulating layer (20F) is formed only of the resin. No inorganic particles are exposed from the first surface (22F). The first surface (22F) does not include surfaces of the inorganic particles. No unevenness is formed on the first surface (22F) of the first resin insulating layer (20F). The first surface (22F) is not roughened. The first surface (22F) is formed smooth.

The first conductor layer (30F) is formed on the first surface (22F) of the first resin insulating layer (20F). The first conductor layer (30F) includes a first signal wiring (32F), a second signal wiring (34F), and lands (36F). Although not illustrated in the drawings, the first conductor layer (30F) also includes conductor circuits other than the first signal wiring (32F), the second signal wiring (34F), and the lands (36F). The first signal wiring (32F) and the second signal wiring (34F) form a pair wiring. The first conductor layer (30F) is mainly formed of copper. The first conductor layer (30F) is formed of a seed layer (30Fa) and an electrolytic plating layer (30Fb) on the seed layer (30Fa). The seed layer (30Fa) is formed by sputtering. The seed layer (30Fa) is formed of a first layer (31Fa) on the first surface (22F) and a second layer (31Fb) on the first layer (31Fa). The first layer (31Fa) is in contact with the first surface (22F). The second layer (31Fb) is not essential.

The first layer (31Fa) is formed of an alloy containing copper, aluminum, and a specific metal. Examples of the specific metal include nickel, zinc, gallium, silicon, and magnesium. The alloy preferably contains one type of specific metal, or two types of specific metals, or three types of specific metals. A content of aluminum in the alloy is 1.0 at % or more and 15.0 at % or less. An example of the specific metal is silicon. A content of the specific metal in the alloy is 0.5 at % or more and 10.0 at % or less. The first layer (31Fa) may contain impurities. Examples of the impurities include oxygen and carbon. The first layer (31Fa) can contain oxygen or carbon. The first layer (31Fa) can contain oxygen and carbon. In the embodiment, the alloy further contains carbon. A content of carbon in the alloy is 50 ppm or less. The alloy further contains oxygen. A content of oxygen in the alloy is 100 ppm or less. The values of the contents of the elements described above are examples. Among the elements forming the first layer (31Fa), copper has the largest content. The content of aluminum is the next largest. The content of the specific metal is less than the content of aluminum. Therefore, copper is a primary metal, aluminum is a first secondary metal, and the specific metal is a second secondary metal. A content of the impurities is smaller than the content of the specific metal.

The second layer (31Fb) is formed of copper. A content of copper forming the second layer (31Fb) is 99.9 at % or more. The content of copper in the second layer (31Fb) is preferably 99.95 at % or more. The electrolytic plating layer (30Fb) is formed of copper. A content of copper forming the electrolytic plating layer (30Fb) is 99.9 at % or more. The content of copper in the electrolytic plating layer (30Fb) is preferably 99.95 at % or more.

The first resin insulating layer (20F) is formed on the glass substrate 4. Since glass is excellent in flatness, the first surface (22F) of the first resin insulating layer (20F) is also excellent in flatness. When no conductive circuit is formed between the front surface (5F) and the first resin insulating layer (20F), the first surface (22F) can follow the front surface (5F). The first surface (22F) can have similar flatness as the front surface (5F). In the embodiment, fine wirings can be formed on the first surface (22F). For example, the first conductor layer (30F) can have wirings having widths of 1.5 μm or more and 3.5 μm or less. A width of a space between adjacent wirings is 1.5 μm or more and 3.5 μm or less.

The first via conductors (40F) are respectively formed in the first openings (26F). The first via conductors (40F) electrically connect the through-hole conductors 8 to the first conductor layer (30F). The first via conductors (40F) electrically connect the through-hole conductors 8 to the lands (36F) of the first via conductor (40F). The first via conductors (40F) are formed of a seed layer (30Fa) and an electrolytic plating layer (30Fb) on the seed layer (30Fa). The seed layer (30Fa) forming the first via conductors (40F) and the seed layer (30Fa) forming the first conductor layer (30F) are common. The electrolytic plating layer (30Fb) forming the first via conductors (40F) and the electrolytic plating layer (30Fb) forming the first conductor layer (30F) are common. The seed layer (30Fa) forming the first via conductors (40F) is formed of a first layer (31Fa), which is formed on inner wall surfaces (27F) of the first openings (26F) and on the upper ends (8F) of the through-hole conductors 8 exposed from the first openings (26F), and a second layer (31Fb) on the first layer (31Fa). In FIG. 1, the first via conductors (40F) are respectively connected to the upper ends (8F). The first layer (31Fa) is in contact with the upper ends (8F) of the through-hole conductors 8 and the inner wall surfaces (27F). The first via conductors (40F) are respectively formed directly on the upper ends (8F).

When the openings for the via conductors expose the front surface (5F), the first layer (31Fa) is in contact with the glass substrate 4. The openings of the first example and the openings of the second example expose the front surface (5F). Further, the openings of the first example and the openings of the second example expose the upper ends (8F). Since the first layer (31Fa) contains aluminum and glass contains oxygen, it is thought that bonding strength between the first layer (31Fa) and the substrate 4 is increased. Further, when the first layer (31Fa) contains silicon, the first layer (31Fa) and the substrate 4 contain the same element (silicon). It is thought that the bonding strength between the first layer (31Fa) and the substrate 4 is further increased. When a part of the seed layer forming the via conductors is in contact with the glass substrate 4, the via conductors are unlikely to peel off from the through-hole conductors 8 even when the wiring substrate 2 is subjected to a thermal shock. The seed layer (for example, the first layer (31Fa)) forming the via conductors that is in contact with the upper ends (8F) is preferably in contact with both the upper ends (8F) and the front surface (5F). Similarly, the seed layer (for example, the first layer) forming the via conductors that is in contact with the lower ends (8B) is preferably in contact with both the lower ends (8B) and the back surface (5B). When an adhesive layer for bonding a resin insulating layer such as the first resin insulating layer (20F) and the substrate 4 is positioned between the front surface (5F) and the second surface (24F), the adhesive layer may be a part of the resin insulating layer. The adhesive layer is included in the resin insulating layer. The adhesive layer includes an organic adhesive layer and an inorganic adhesive layer. The adhesive layer is formed of an insulating material.

The second resin insulating layer (120F) is formed on the first surface (22F) of the first resin insulating layer (20F) and on the first conductor layer (30F). The first conductor layer (30F) is formed between the second resin insulating layer (120F) and the first resin insulating layer (20F). The second resin insulating layer (120F) has a first surface (122F) and a second surface (124F) on the opposite side with respect to the first surface (122F). The second surface (124F) of the second resin insulating layer (120F) faces the first conductor layer (30F). Similar to the first resin insulating layer (20F), the second resin insulating layer (120F) is formed of a resin and inorganic particles. Therefore, the material of the second resin insulating layer (120F) is similar to the material of the first resin insulating layer (20F). The first surface (122F) of the second resin insulating layer (120F) is similar to the first surface (22F) of the first resin insulating layer (20F).

The second resin insulating layer (120F) has second openings (126F) that expose the first conductor layer (30F). The second openings (126F) respectively expose the lands (36F). The second openings (126F) each have an inner wall surface (127F). The first openings (26F) and the second openings (126F) are similar. Therefore, the inner wall surfaces (27F) of the first openings (26F) and the inner wall surfaces (127F) of the second openings (126F) are similar.

The second conductor layer (130F) is formed on the first surface (122F) of the second resin insulating layer (120F). The second conductor layer (130F) includes a first signal wiring (132F), a second signal wiring (134F), and lands (136F). Although not illustrated in the drawings, the second conductor layer (130F) also includes conductor circuits other than the first signal wiring (132F), the second signal wiring (134F), and the lands (136F). The first signal wiring (132F) and the second signal wiring (134F) form a pair wiring. The second conductor layer (130F) and the first conductor layer (30F) are similar. Therefore, the second conductor layer (130F) is formed of a seed layer (130Fa) and an electrolytic plating layer (130Fb) on the seed layer (130Fa). The seed layer (130Fa) is formed of a first layer (131Fa) and a second layer (131Fb) on the first layer (131Fa). The first layer (131Fa) forming the second conductor layer (130F) is similar to the first layer (31Fa) forming the first conductor layer (30F). The second layer (131Fb) forming the second conductor layer (130F) is similar to the second layer (31Fb) forming the first conductor layer (30F). The electrolytic plating layer (130Fb) forming the second conductor layer (130F) is similar to the electrolytic plating layer (30Fb) forming the first conductor layer (30F).

The second via conductors (140F) are respectively formed in the second openings (126F). The second via conductors (140F) electrically connect the first conductor layer (30F) and the second conductor layer (130F). In FIG. 1, the second via conductors (140F) respectively electrically connect the lands (36F) to the lands (136F). The second via conductors (140F) and the first via conductors (40F) are similar. Therefore, the second via conductors (140F) are formed of a seed layer (130Fa) and an electrolytic plating layer (130Fb) on the seed layer (130Fa). The seed layer (130Fa) is formed of a first layer (131Fa) and a second layer (131Fb) on the first layer (131Fa). The first layer (131Fa) forming the second via conductors (140F) and the first layer (131Fa) forming the second conductor layer (130F) are common. The second layer (131Fb) forming the second via conductors (140F) and the second layer (131Fb) forming the second conductor layer (130F) are common. The electrolytic plating layer (130Fb) forming the second via conductors (140F) and the electrolytic plating layer (130Fb) forming the second conductor layer (130F) are common.

The back side build-up layer (300B) includes back side resin insulating layers, back side conductor layers, and back side via conductors that penetrate the back side resin insulating layers. The back side resin insulating layers and the back side conductor layers are alternately laminated. The back side conductor layers and the back side via conductors are electrically connected to the through-hole conductors 8. The back side resin insulating layers in FIG. 1 are a first resin insulating layer (20B) having a first surface (22B) and a second surface (24B) and a second resin insulating layer (120B) having a first surface (122B) and a second surface (124B). The back side conductor layers are a first conductor layer (30B) and a second conductor layer (130B). The first conductor layer (30B) and the second conductor layer (130B) include first signal wirings (32B, 132B) and second signal wirings (34B, 134B). The back side via conductors are first via conductors (40B) and second via conductors (140B).

The front side build-up layer (300F) and the back side build-up layer (300B) are similar. Therefore, the front side resin insulating layers forming the front side build-up layer (300F) and the back side resin insulating layers forming the back side build-up layer (300B) are similar. The back side resin insulating layers are each formed of a resin and inorganic particles. The first surface of each of the resin insulating layers is formed only of the resin. The front side conductor layers and the back side conductor layers are similar. The openings for the front side via conductors and the openings for the back side via conductors are similar. The front side via conductors and the back side via conductors are similar.

Although not illustrated in the drawings, each side of the wiring substrate 2 has a length of 50 mm or more. The length of each side is preferably 100 mm or more. The length of each side is 250 mm or less. A length of a signal wiring formed according to the embodiment is 5 mm or more. The length of the signal wiring may be 10 mm or more and 20 mm or less.

Method for Manufacturing Wiring Substrate

Figure 2B:
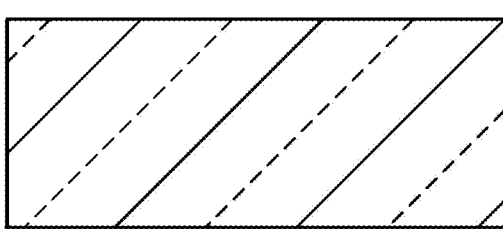
FIG. 2B is a cross-sectional view schematically illustrating a method for manufacturing a wiring substrate according to an embodiment of the present invention.
Figure 2B:
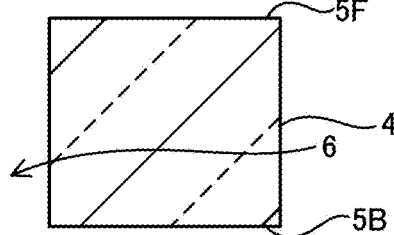

FIGS. 2A-2J illustrate a method for manufacturing the wiring substrate 2 of the embodiment. FIGS. 2A-2J are cross-sectional views. FIG. 2A illustrates the glass substrate 4. The substrate 4 has the front surface (5F) and the back surface (5B). As illustrated in FIG. 2B, the through holes 6 each extending from the front surface (5F) to the back surface (5B) are formed. The through holes 6 penetrate the substrate 4. Laser is irradiated from the front surface (5F) side of the substrate 4. After that, the substrate 4 is immersed in a hydrofluoric acid. The through holes 6 are formed.

Figure 2C:
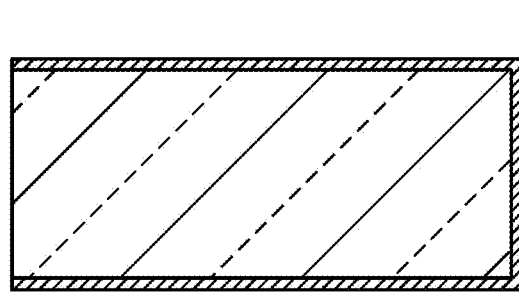
FIG. 2C is a cross-sectional view schematically illustrating a method for manufacturing a wiring substrate according to an embodiment of the present invention.
Figure 2C:
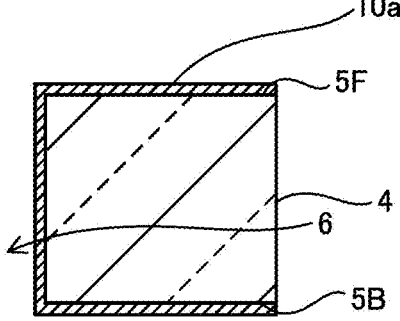

As illustrated in FIG. 2C, the seed layer (10a) is formed. The seed layer (10a) is formed by electroless plating. The seed layer (10a) is formed on the inner wall surfaces of the through holes 6, on the front surface (5F), and on the back surface (5B).

Figure 2D:
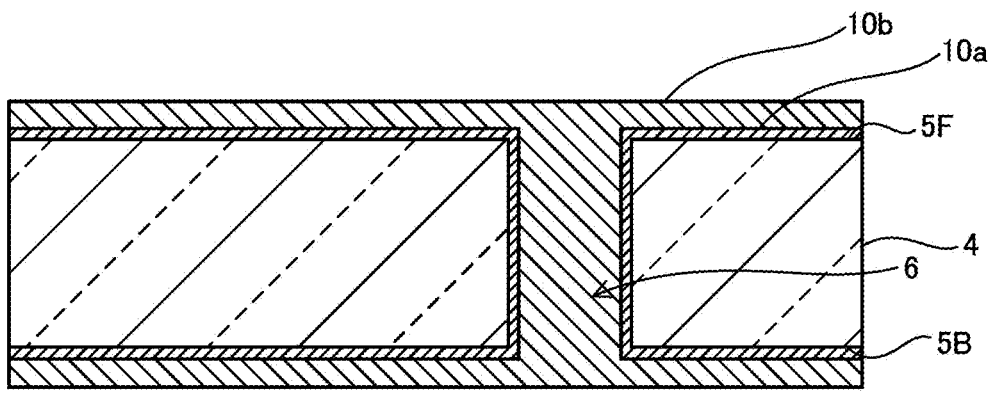
FIG. 2D is a cross-sectional view schematically illustrating a method for manufacturing a wiring substrate according to an embodiment of the present invention.

As illustrated in FIG. 2D, the electrolytic plating layer (10b) is formed. The electrolytic plating layer (10b) is formed on the seed layer (10a). The electrolytic plating layer (10b) fills the through holes 6.

Figure 2E:
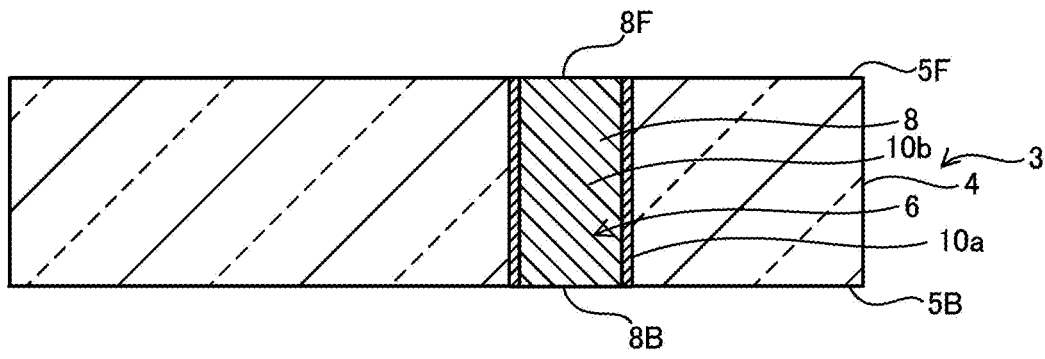
FIG. 2E is a cross-sectional view schematically illustrating a method for manufacturing a wiring substrate according to an embodiment of the present invention.

As illustrated in FIG. 2E, the electrolytic plating layer (10b) and the seed layer (10a) on the front surface (5F) are removed by polishing. The electrolytic plating layer (10b) and the seed layer (10a) on the back surface (5B) are removed by polishing. The front surface (5F) and the back surface (5B) of the substrate 4 are exposed. The through-hole conductors 8 are formed by the seed layer (10a) on the inner wall surfaces of the through holes 6 and the electrolytic plating layer (10b) on the seed layer (10a). The upper ends (8F) of the through-hole conductors 8 are exposed from the front surface (5F). The lower ends (8B) of the through-hole conductors 8 are exposed from the back surface (5B). Surfaces forming the upper ends (8F) and the front surface (5F) form the same flat surface. Surfaces forming the lower ends (8B) and the back surface (5B) form the same flat surface. The core substrate 3 (FIG. 1) is formed. The core substrate 3 in FIG. 1 has no conductor circuit on the front surface (5F). The core substrate 3 in FIG. 1 has no conductor circuit on the back surface (5B).

The front side build-up layer (300F) and the back side build-up layer (300B) are formed on core substrate 3 using similar methods. The method for forming the front side build-up layer (300F) is described below. The back side build-up layer (300B) is also depicted in the drawings.

Figure 2F:
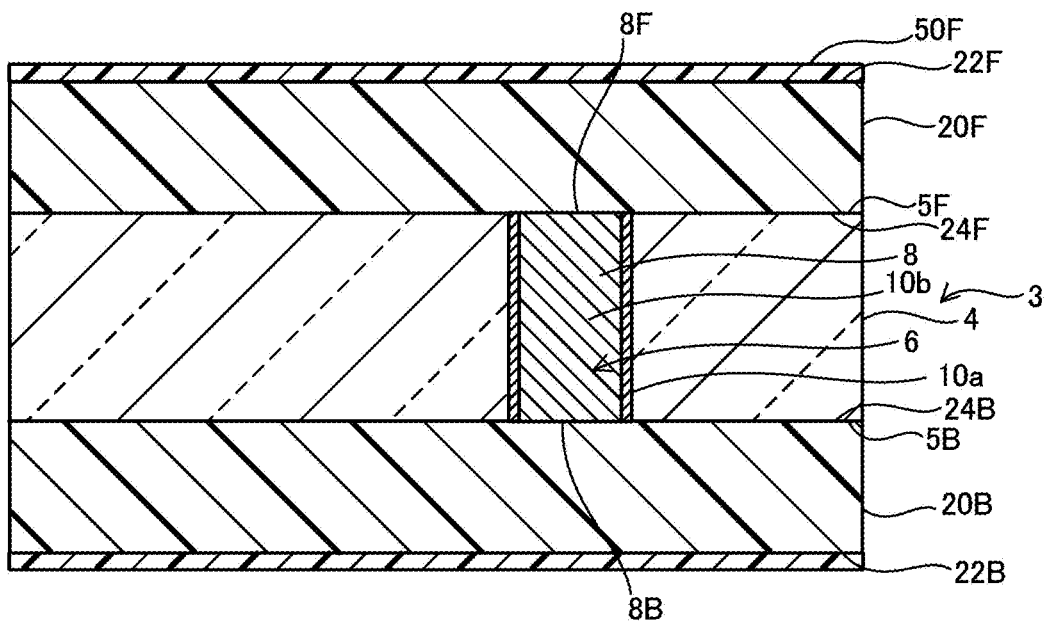
FIG. 2F is a cross-sectional view schematically illustrating a method for manufacturing a wiring substrate according to an embodiment of the present invention.

As illustrated in FIG. 2F, the first resin insulating layer (20F) and a protective film (50F) are formed on the front surface (5F) of the substrate 4 and on the upper ends (8F). The second surface (24F) of the first resin insulating layer (20F) faces the front surface (5F) of the substrate 4. The protective film (50F) is formed on the first surface (22F) of the first resin insulating layer (20F). The first surface (22F) of the first resin insulating layer (20F) is formed only of the resin. No inorganic particles are exposed from the first surface (22F). The first surface (22F) does not include surfaces of the inorganic particles. No unevenness is formed on the first surface (22F) of the first resin insulating layer (20F). The first resin insulating layer (20F) is formed on a flat surface formed by the front surface (5F) and the upper ends (8F). Therefore, the first surface (22F) is formed as a substantially flat surface. The front surface (5F) and the first surface (22F) are substantially parallel.

Figure 2G:
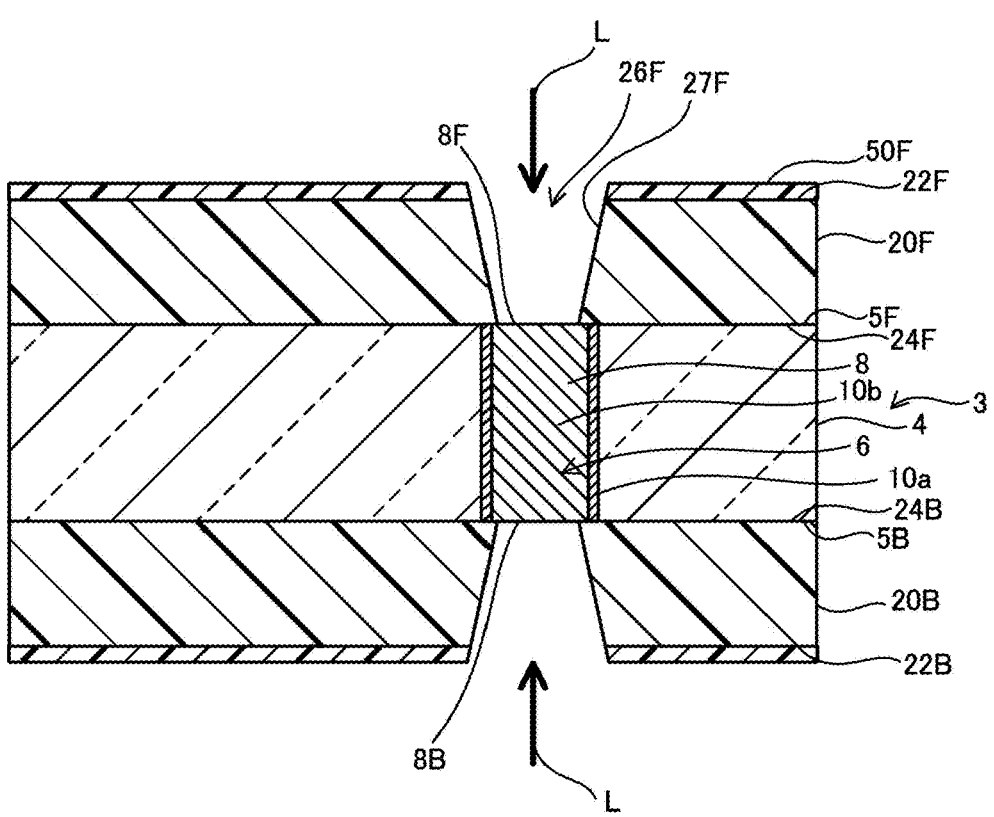
FIG. 2G is a cross-sectional view schematically illustrating a method for manufacturing a wiring substrate according to an embodiment of the present invention.

As illustrated in FIG. 2G, laser (L) is irradiated from above the protective film (50F). The laser (L) penetrates the protective film (50F) and the first resin insulating layer (20F) at the same time. The first openings (26F) for the via conductors reaching the upper ends (8F) of the through-hole conductors 8 are formed. The laser (L) is, for example, UV laser, or $CO_2$ laser. The upper ends (8F) of the through-hole conductors 8 are exposed from the first openings (26F). When the first openings (26F) are formed, the first surface (22F) is covered by the protective film (50F). When the first openings (26F) are formed, even when the resin scatters, adherence of the resin to the first surface (22F) is suppressed.

The first surface (22F) is excellent in flatness. When the laser (L) is irradiated to the first surface (22F), the laser (L) is unlikely to be diffusely reflected. When each of the first openings (26F) is formed, a focus position of the laser (L) is likely to match. Openings for via conductors with small diameters can be formed. The diameters of the openings for the via conductors are substantially equal to each other. For example, openings for via conductors having diameters of 15 μm or more and 35 μm or less can be formed. The diameters are measured on the first surface (22F).

Insides of the first openings (26F) are cleaned. By cleaning the insides of the first openings (26F), resin residues generated when the first openings (26F) are formed are removed. The cleaning of the insides of the first openings (26F) is performed using plasma. That is, the cleaning is performed with a dry process. The cleaning includes a desmear treatment. By the plasma, the resin is selectively removed. The plasma removes the resin faster than the inorganic particles. The inner wall surfaces (27F) of the first openings (26F) are roughened by the plasma.

By cleaning the insides of the first openings (26F), the inorganic particles are exposed on the inner wall surfaces (27F) of the first openings (26F). The inner wall surface (27F) of each of the first openings (26F) includes surfaces of the inorganic particles. On the other hand, the first surface (22F) of the first resin insulating layer (20F) is covered by the protective film (50F). The first surface (22F) is not affected by the plasma. The first surface (22F) is formed only of the resin. No inorganic particles are exposed from the first surface (22F). The first surface (22F) does not include surfaces of the inorganic particles. The first surface (22F) of the first resin insulating layer (20F) has no unevenness. The first surface (22F) is formed smooth.

Figure 2H:
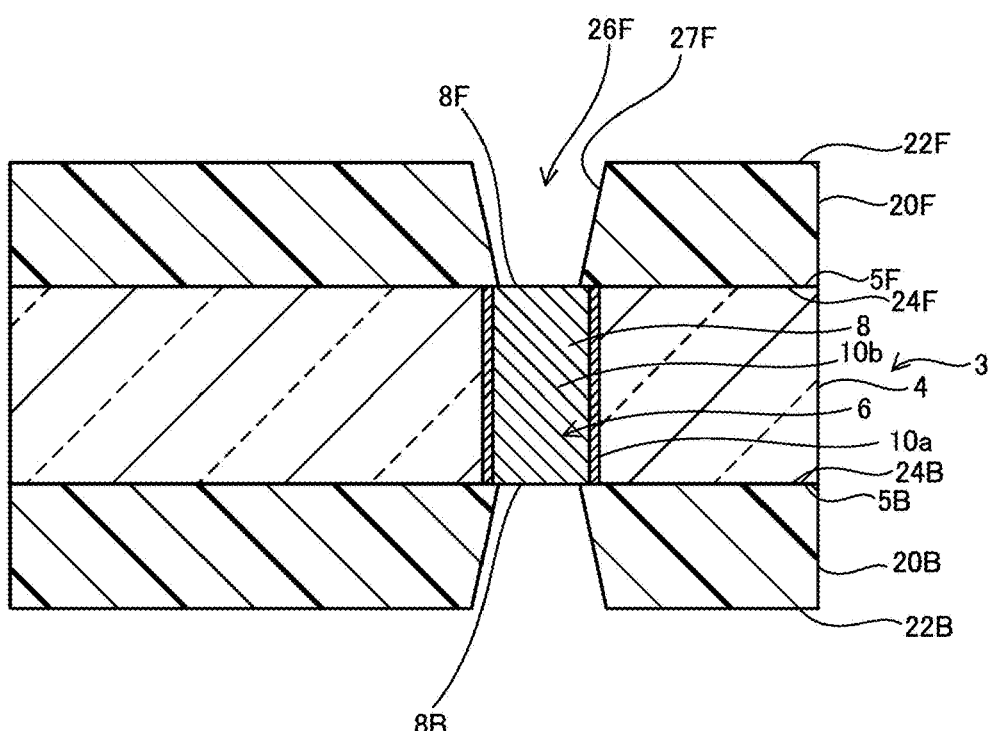
FIG. 2H is a cross-sectional view schematically illustrating a method for manufacturing a wiring substrate according to an embodiment of the present invention.

As illustrated in FIG. 2H, the protective film (50F) is removed from the resin insulating layer (20F). After the protective film (50F) is removed, the first surface (22F) of the first resin insulating layer (20F) is not roughened.

Figure 2I:
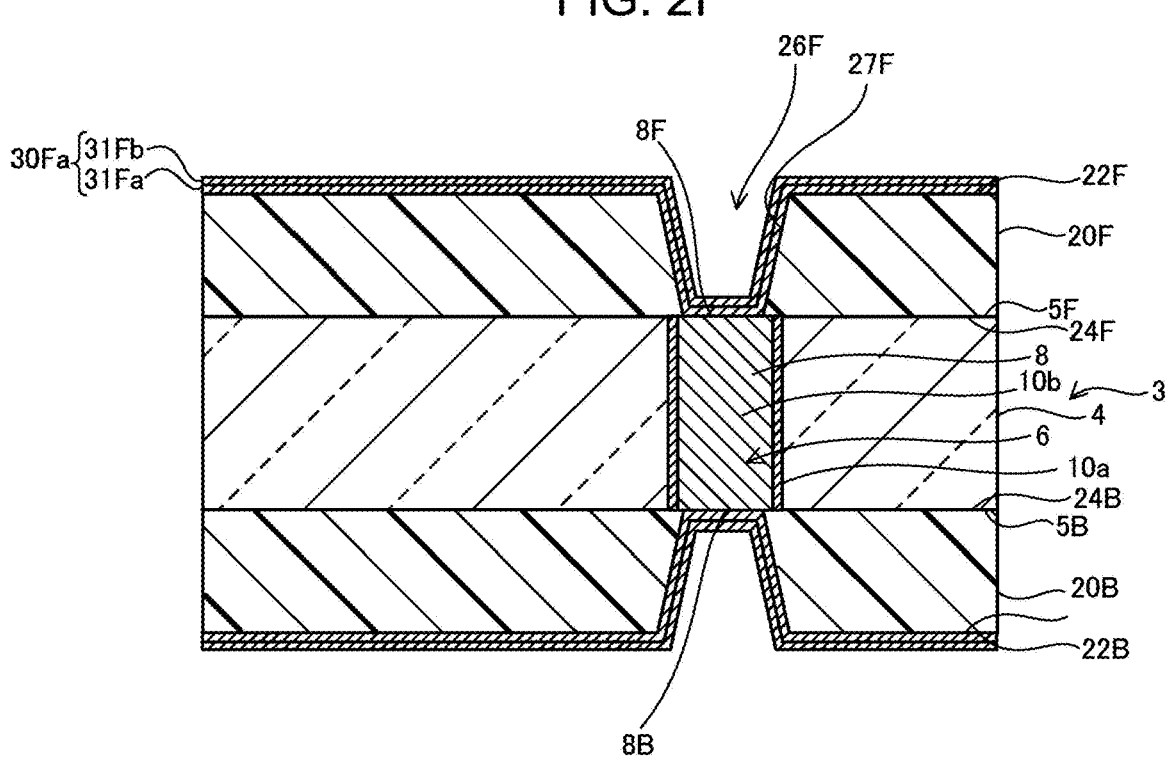
FIG. 2I is a cross-sectional view schematically illustrating a method for manufacturing a wiring substrate according to an embodiment of the present invention.

As illustrated in FIG. 2I, the seed layer (30Fa) is formed on the first surface (22F) of the first resin insulating layer (20F). The seed layer (30Fa) is formed by sputtering. The formation of the seed layer (30Fa) is performed with a dry process. The seed layer (30Fa) is also formed on the upper ends (8F) of the through-hole conductors 8 exposed from the first openings (26F) and on the inner wall surfaces (27F) of the first openings (26F). The first layer (31Fa) is formed on the first surface (22F) by sputtering. The first layer (31Fa) is formed by sputtering on the inner wall surfaces (27F) exposed from the first openings (26F) and on the upper ends (8F) of the through-hole conductors 8. The second layer (31Fb) is formed on the first layer (31Fa) by sputtering.

The first layer (31Fa) of the seed layer (30Fa) is formed of an alloy containing copper, aluminum and silicon. Aluminum has high ductility and high malleability. Therefore, adhesion between the first resin insulating layer (20F) and the first layer (31Fa) is high. It is thought that even when the first resin insulating layer (20F) expands and contracts due to heat cycles, the seed layer (30Fa) containing aluminum can follow the expansion and contraction. Even when the first surface (22F) is smooth, the seed layer (30Fa) is unlikely to peel off from the first resin insulating layer (20F). It is thought that aluminum is easily oxidized. It is thought that the first layer (31Fa) formed on the inner wall surfaces (27F) of the first openings (26F) adheres to the inorganic particles via the oxygen in the inorganic particles (for example, glass particles) forming the inner wall surfaces (27F). The first layer (31Fa) is strongly bonded to the inner wall surfaces (27F). Adhesion between the inner wall surfaces (27F) of the first openings (26F) and the first layer (31Fa) can be increased. The seed layer (30Fa) is unlikely to peel off from the inner wall surfaces (27F). It is preferable that the inorganic particles forming the inner wall surfaces (27F) contain oxygen.

The first surface (22F) is excellent in flatness. When the seed layer (30Fa) is formed on the first surface (22F) by sputtering, a distance between a target and the first surface (22F) is substantially constant. A seed layer (30Fa) having a substantially uniform thickness can be formed.

A plating resist is formed on the seed layer (30Fa). The plating resist has openings for forming the first signal wiring (32F), the second signal wiring (34F), and the lands (36F) (FIG. 1).

The electrolytic plating layer (30Fb) is formed on the seed layer (30Fa) exposed from the plating resist. The electrolytic plating layer (30Fb) fills the first openings (26F). The first signal wiring (32F), the second signal wiring (34F), and the lands (36F) (FIG. 1) are formed by the seed layer (30Fa) and the electrolytic plating layer (30Fb) on the first surface (22F). The first conductor layer (30F) is formed. The first via conductors (40F) (FIG. 1) are formed by the seed layer (30Fa) and the electrolytic plating layer (30Fb) in the first openings (26F). The first via conductors (40F) connect the through-hole conductors 8 and the lands (36F). The first signal wiring (32F) and the second signal wiring (34F) form a pair wiring.

Figure 2J:
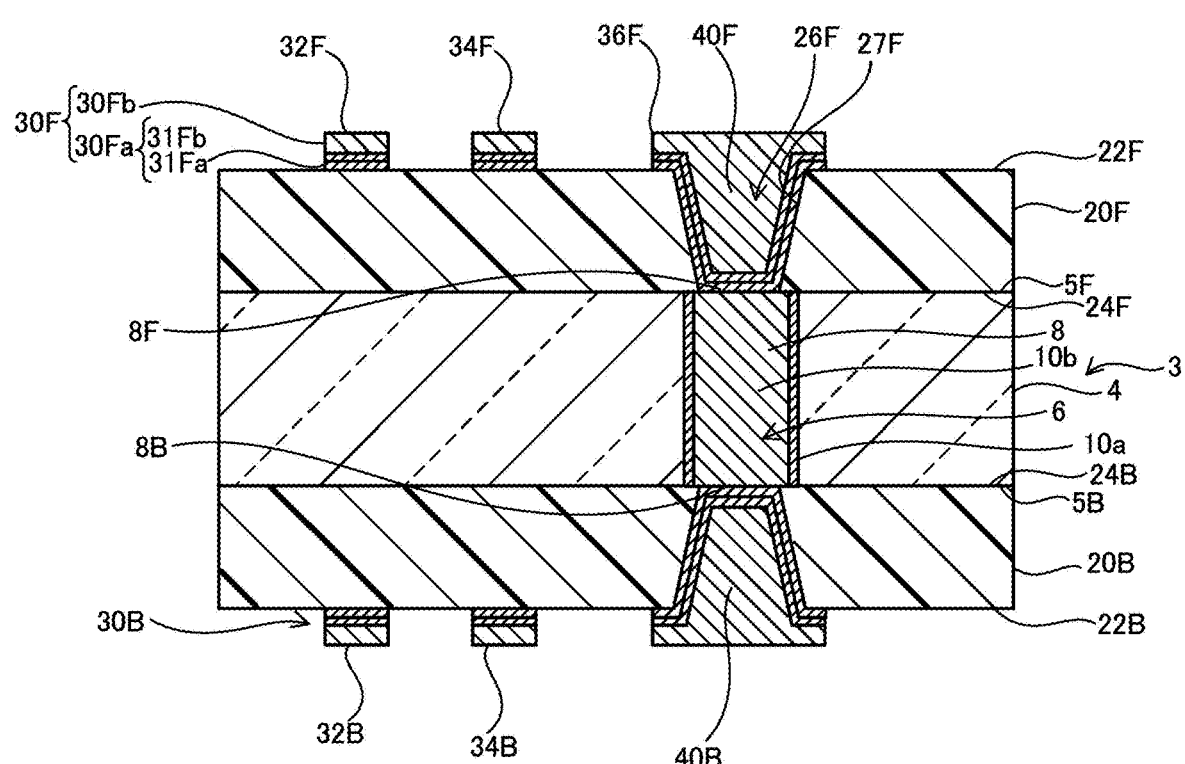
FIG. 2J is a cross-sectional view schematically illustrating a method for manufacturing a wiring substrate according to an embodiment of the present invention.

The plating resist is removed. The seed layer (30Fa) exposed from the electrolytic plating layer (30Fb) is removed. As illustrated in FIG. 2J, the first conductor layer (30F) and the first via conductors (40F) are formed at the same time.

The second resin insulating layer (120F) is formed on the first surface (22F) of the first resin insulating layer (20F) and on the first conductor layer (30F). The second conductor layer (130F) is formed on the first surface (122F) of the second resin insulating layer (120F). The second via conductors (140F) are formed in the second openings (126F) of the second resin insulating layer (120F). The second resin insulating layer (120F) is formed using the same method as the first resin insulating layer (20F). The second conductor layer (130F) is formed using the same method as the first conductor layer (30F). The second via conductors (140F) are formed using the same method as the first via conductors (40F). The wiring substrate 2 of the embodiment (FIG. 1) is obtained.

The core substrate 3 of the wiring substrate 2 of the embodiment (FIG. 1) includes the glass substrate 4. The glass substrate 4 is excellent in flatness. The first surfaces (22F, 22B) of the first resin insulating layers (20F, 20B) are excellent in flatness and smoothness. Fine signal wirings (32F, 32B, 34F, 34B) can be formed on the first surfaces (22F, 22B) of the first resin insulating layers (20F, 20B). The first surfaces (122F, 122B) of the second resin insulating layers (120F, 120B) are similar to the first surfaces (22F, 22B) of the first resin insulating layers (20F, 20B). Therefore, fine signal wirings (132F, 132B, 134F, 134B) can be formed on the first surfaces (122F, 122B) of the second resin insulating layers (120F, 120B). The L/S of a signal wiring formed according to the embodiment is, for example, less than 5 μm/5 μm. The L/S of a signal wiring is preferably 1.5 μm/1.5 μm or more and 3.5 μm/3.5 μm or less. L means a width of a signal wiring, and S means a width of a space between adjacent signal wirings.

In the wiring substrate 2 of the embodiment (FIG. 1), the first surfaces (22F, 22B) of the first resin insulating layers (20F, 20B) are excellent in flatness and smoothness. An increase in standard deviation of a relative permittivity in a portion near the first surfaces (22F, 22B) of the first resin insulating layers (20F, 20B) is suppressed. The relative permittivity of the first surfaces (22F, 22B) does not significantly vary depending on a location. Even when the first signal wiring (32F, 32B) and the second signal wiring (34F, 34B) are in contact with the first surface (22F, 22B), a difference in propagation speed of an electrical signal between the first signal wiring (32F, 32B) and the second signal wiring (34F, 34B) can be reduced. Therefore, in the wiring substrate 2 of the embodiment, noise is suppressed. Even when a logic IC is mounted on the wiring substrate 2 of the embodiment, data transmitted via the first signal wiring (32F, 32B) and data transmitted via the second signal wiring (34F, 34B) arrive at the logic IC substantially without delay. Malfunction of the logic IC can be suppressed. Even when a length of the first signal wiring (32F, 32B) and a length of the second signal wiring (34F, 34B) are 5 mm or more, a difference in the propagation speed between the two can be reduced. Even when the length of the first signal wiring (32F, 32B) and the length of the second signal wiring (34F, 34B) are 10 mm or more and 20 mm or less, malfunction of the logic IC can be suppressed. The first surfaces (122F, 122B) of the second resin insulating layers (120F, 120B) are similar to the first surfaces (22F, 22B) of the first resin insulating layers (20F, 20B). Therefore, the first signal wirings (132F, 132B) and the second signal wirings (134F, 134B) have similar effects as the first signal wirings (32F, 32B) and the second signal wirings (34F, 34B). A high quality wiring substrate 2 is provided.

First Alternative Example

In a first alternative example of the embodiment, the specific metal contained in the alloy forming the first layers (31Fa, 131Fa) of the seed layers (30Fa, 130Fa) is at least one of nickel, zinc, gallium, silicon, and magnesium.

Second Alternative Example

In a second alternative example of the embodiment, the alloy forming the first layers (31Fa, 131Fa) of the seed layers (30Fa, 130Fa) does not contain carbon.

Third Alternative Example

In a third alternative example of the embodiment, the alloy forming the first layers (31Fa, 131Fa) of the seed layers (30Fa, 130Fa) does not contain oxygen.

Modified Examples

Figure 3:
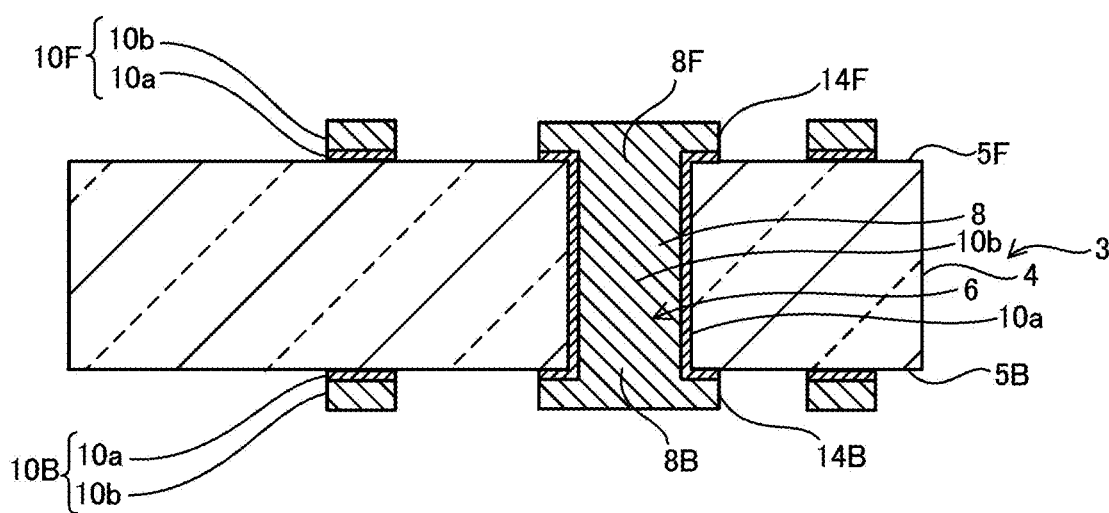
FIG. 3 is a cross-sectional view schematically illustrating a method for manufacturing a wiring substrate of a modified example according to an embodiment of the present invention.
Figure 4:
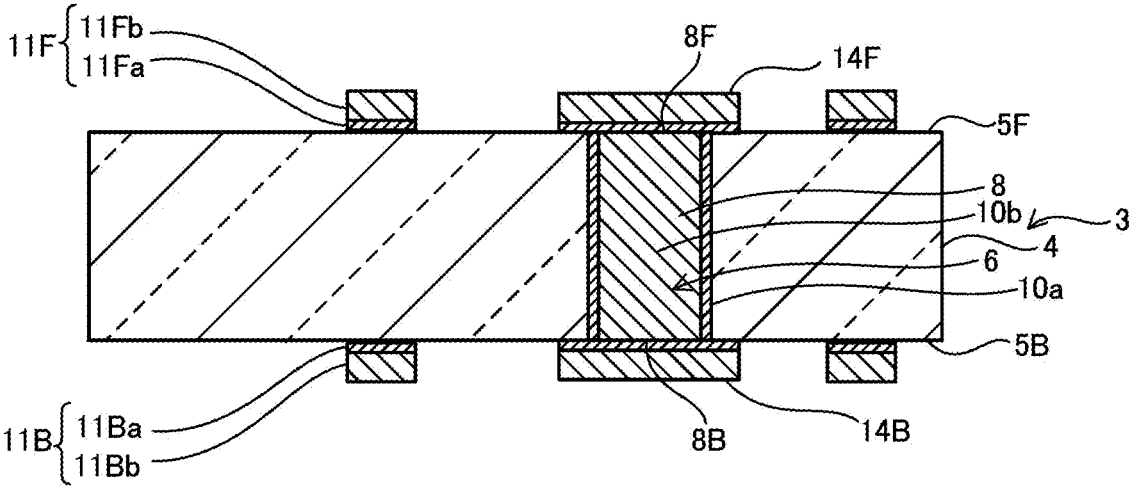
FIG. 4 is a cross-sectional view schematically illustrating a method for manufacturing a wiring substrate of a modified example according to an embodiment of the present invention.

Similar to the embodiment, wiring substrates of modified examples each include a core substrate 3, a front side build-up layer (300F), and a back side build-up layer (300B). The core substrate 3 of the embodiment is different from the core substrates 3 of the modified examples. The front side build-up layer (300F) of the embodiment is the same as the front side build-up layer (300F) of each of the modified examples. The back side build-up layer (300B) of the embodiment is the same as the back side build-up layer (300B) of each of the modified examples. Cross-sections of the core substrates 3 of the modified examples are respectively illustrated in FIGS. 3 and 4. As illustrated in FIGS. 3 and 4, the core substrates 3 of the modified examples respectively have conductor layers (10F, 11F) on the front surface (5F) of the glass substrate 4. The conductor layers (10F, 11F) each include lands (14F) covering the upper ends (8F) of the through-hole conductors 8. Further, the core substrates 3 of the modified examples respectively have conductor layers (10B, 11B) on the back surface (5B) of the substrate 4. The conductor layers (10B, 11B) each include lands (14B) covering the lower ends (8B) of the through-hole conductors 8. The lands (14F) and the lands (14B) are electrically connected by the through-hole conductors 8. The core substrate 3 of the embodiment has no conductor layer on the front surface (5F) and no conductor layer on the back surface (5B).

In the modified examples, the front side resin insulating layer (resin insulating layer directly above the core substrate) forming the front side build-up layer (300F) is formed on the conductor layer (10F, 11F) and the front surface (5F). The resin insulating layer (first resin insulating layer (20F)) directly above the core substrate has openings (first openings (26F)) for via conductors reaching the lands (14F). Via conductors (first via conductors (40F)) similar to those of the embodiment are formed in the openings for via conductors. Since the via conductors penetrating the resin insulating layer directly above the core substrate reach the lands (14F), the seed layer (first layer (31Fa)) forming the via conductors is in contact with upper surfaces of the lands (14F) and inner wall surfaces of the openings. The via conductors penetrating the resin insulating layer directly above the core substrate are electrically connected to the through-hole conductors 8 via the lands (14F).

In the modified examples, the back side resin insulating layer (resin insulating layer directly below the core substrate) forming the back side build-up layer (300B) is formed on the conductor layer (10B, 11B) and the back surface (5B). The resin insulating layer (first resin insulating layer (20B)) directly below the core substrate has openings (first openings) for via conductors reaching the lands (14B). Via conductors (first via conductors (40B)) similar to those of the embodiment are formed in the openings for via conductors. Since the via conductors penetrating the resin insulating layer directly below the core substrate reach the lands (14B), the seed layer forming the via conductors is in contact with upper surfaces of the lands (14B) and inner wall surfaces of the openings. The via conductors penetrating the resin insulating layer directly below the core substrate are electrically connected to the through-hole conductors 8 via the lands (14B).

Method for Manufacturing Wiring Substrates of Modified Examples

The core substrate 3 illustrated in FIG. 3 is a core substrate 3 of a first example. A method for manufacturing the core substrate 3 of the first example is described below. An intermediate substrate illustrated in FIG. 2D is prepared. The conductor layer (10F) is formed on the front surface (5F) using a subtractive method. The conductor layer (10B) is formed on the back surface (5B). The core substrate 3 of the first example of the modified examples is obtained.

The conductor layer (10F) is formed of the seed layer (10a) and the electrolytic plating layer (10b) on the seed layer (10a). The conductor layer (10B) is formed of the seed layer (10a) and the electrolytic plating layer (10b) on the seed layer (10a). The seed layer (10a) is formed by electroless plating. The seed layer (10a) forming the conductor layer (10F), the seed layer (10a) forming the conductor layer (10B), and the seed layer (10a) forming the through-hole conductors 8 are common. The electrolytic plating layer (10b) forming the conductor layer (10F), the electrolytic plating layer (10b) forming the conductor layer (10B), and the electrolytic plating layer (10b) forming the through-hole conductors 8 are common. The conductor layers (10F, 10B) and the through-hole conductors 8 are formed at the same time. The through-hole conductors 8 and the lands (14F, 14B) are formed at the same time. The through-hole conductors 8 and the lands (14F, 14B) are integrally formed. There is no seed layer between the upper ends (8F) and the lands (14F). There is no seed layer between the lower ends (8B) and the lands (14B).

The core substrate 3 illustrated in FIG. 4 is the core substrate 3 of a second example. A method for manufacturing the core substrate 3 of the second example is described below. An intermediate substrate illustrated in FIG. 2E is prepared. Seed layers (11Fa, 11Ba) are respectively formed on the front surface (5F) and the back surface (5B). The seed layers (11Fa, 11Ba) are formed by electroless plating. It is also possible that the seed layers (11Fa, 11Ba) are formed by sputtering. The seed layer (11Fa) covers the front surface (5F) of the substrate 4 and the upper ends (8F) of the through-hole conductors 8. The seed layer (11Ba) covers the back surface (5B) of the substrate 4 and the lower ends (8B) of the through-hole conductors 8. Electrolytic plating layers (11Fb, 11Bb) are respectively formed on the seed layers (11Fa, 11Ba). After that, the conductor layers (11F, 11B) are formed using a subtractive method. The core substrate 3 of the second example of the modified examples is obtained.

The conductor layer (11F) is formed of the seed layer (11Fa) and the electrolytic plating layer (11Fb) on the seed layer (11Fa). The conductor layer (11B) is formed of the seed layer (11Ba) and the electrolytic plating layer (11Bb) on the seed layer (11Ba). The seed layer (11Fa) is formed on the front surface (5F) of the substrate 4. The seed layer (11Fa) covers the upper ends (8F) of the through-hole conductors 8. The seed layer (11Ba) is formed on the back surface (5B) of the substrate 4. The seed layer (11Ba) covers the lower ends (8B) of the through-hole conductors 8. The seed layers (11Fa, 11Ba) are formed by electroless plating. It is also possible that the seed layers (11Fa, 11Ba) are formed by sputtering. The seed layers (11Fa, 11Ba) that respectively form the conductor layers (11F, 11B) and the seed layer (10a) that forms the through-hole conductors 8 are different from each other. The electrolytic plating layers (11Fb, 11Bb) that respectively form the conductor layers (11F, 11B) and the electrolytic plating layer (10b) that forms the through-hole conductors 8 are different from each other. The conductor layers (11F, 11B) and the through-hole conductors 8 are separately formed. In the second example, the seed layer (11Fa) forming the lands (14F) exists between the electrolytic plating layer (10b) forming the upper ends (8F) and the electrolytic plating layer (11Fb) forming the lands (14F). The seed layer (11Ba) forming the lands (14B) exists between the electrolytic plating layer (10b) forming the lower ends (8B) and the electrolytic plating layer (11Bb) forming the lands (14B). In contrast, in the first example (FIG. 3), the electrolytic plating layer (10b) forming the upper ends (8F) and the electrolytic plating layer (10b) forming the lands (14F) are continuous. The electrolytic plating layer (10b) forming the lower ends (8B) and the electrolytic plating layer (10b) forming the lands (14B) are continuous.

The front side build-up layer (300F) and back side build-up layer (300B) are formed on each of the core substrates 3 of the modified examples in the same way as the embodiment.

In Japanese Patent Application Laid-Open Publication No. 2015-133473, light transmittance of a first insulating layer formed of a glass material is controlled. As an example of a method for controlling the light transmittance, Japanese Patent Application Laid-Open Publication No. 2015-133473 describes that a coloring agent is contained in the first insulating layer. It is thought difficult for the first insulating layer formed of a glass material to uniformly contain a coloring agent.

A wiring substrate according to an embodiment of the present invention includes a core substrate that has a substrate formed of glass, a through hole penetrating the substrate, and a through-hole conductor formed in the through hole, a resin insulating layer that is formed on the core substrate and has a first surface and a second surface on the opposite side with respect to the first surface, a first conductor layer that is formed on the first surface of the resin insulating layer, and a via conductor that penetrates the resin insulating layer and is electrically connected to the through-hole conductor. The first conductor layer and the via conductor are formed of a seed layer and an electrolytic plating layer formed on the seed layer. The seed layer is formed by sputtering and is formed of an alloy containing copper, aluminum, and a specific metal, and the specific metal is at least one of nickel, zinc, gallium, silicon, and magnesium.

In a wiring substrate according to an embodiment of the present invention, the core substrate includes the glass substrate. The glass substrate is excellent in flatness. Therefore, the first surface of the resin insulating layer is excellent in flatness. The first surface is excellent in smoothness. Fine signal wirings can be formed on the first surface of the resin insulating layer. In a wiring substrate according to embodiment of the present invention, the seed layer is formed of an alloy containing copper, aluminum and a specific metal. Aluminum has high ductility and high malleability. Adhesion between resin insulating layer and the seed layer is high. Since a difference in thermal expansion coefficient between the glass core substrate and the resin insulating layer is significantly large, when the wiring substrate is subjected to heat cycles, a stress occurs between the resin insulating layer and the seed layer. It is thought that even when the resin insulating layer expands and contracts due to heat cycles, the seed layer containing aluminum can follow the expansion and contraction. The seed layer is unlikely to peel off from the resin insulating layer.

Obviously, numerous modifications and variations of the present invention are possible in light of the above teachings. It is therefore to be understood that within the scope of the appended claims, the invention may be practiced otherwise than as specifically described herein.

The invention claimed is:

1. A wiring substrate, comprising:
a core substrate including a through-hole conductor;
a resin insulating layer formed on the core substrate;
a conductor layer formed on a surface of the resin insulating layer and comprising a seed layer and an electrolytic plating layer formed on the seed layer; and
a via conductor formed in the resin insulating layer such that the via conductor is connected to the through-hole conductor in the core substrate and includes the seed layer and electrolytic plating layer extending from the conductor layer,
wherein the core substrate includes a glass substrate such that the through-hole conductor is formed in a through hole penetrating through the glass substrate, the resin insulating layer is formed on a surface of the glass substrate, and the core substrate has no conductor circuit formed on the surface of the glass substrate, and the conductor layer and via conductor are formed such that the seed layer is formed by sputtering and includes an alloy comprising copper, aluminum, and at least one metal selected from the group consisting of nickel, zinc, gallium, silicon, and magnesium.

2. The wiring substrate according to claim 1, wherein the seed layer in the conductor layer and via conductor are formed such that the at least one metal in the alloy includes silicon.

3. The wiring substrate according to claim 2, wherein the seed layer in the conductor layer and via conductor are formed such that a content of silicon in the alloy is in a range of 0.5 at % to 10.0 at %.

4. The wiring substrate according to claim 1, wherein the seed layer in the conductor layer and via conductor are formed such that a content of aluminum in the alloy is in a range of 1.0 at % to 15.0 at %.

5. The wiring substrate according to claim 1, wherein the seed layer in the conductor layer and via conductor are formed such that the alloy includes carbon.

6. The wiring substrate according to claim 5, wherein the seed layer in the conductor layer and via conductor are formed such that a content of carbon in the alloy is 50 ppm or less.

7. The wiring substrate according to claim 1, wherein the seed layer in the conductor layer and via conductor are formed such that the alloy includes oxygen.

8. The wiring substrate according to claim 7, wherein the seed layer in the conductor layer and via conductor are formed such that a content of oxygen in the alloy is 100 ppm or less.

9. The wiring substrate according to claim 1, wherein the core substrate is formed such that the resin insulating layer is formed in contact with a surface of the glass substrate and that no conductor circuit is formed on the surface of the glass substrate.

10. The wiring substrate according to claim 9, wherein the via conductor is formed such that the seed layer in the via conductor is in contact with an end portion of the through-hole conductor in the core substrate and the surface of the glass substrate.

11. The wiring substrate according to claim 10, wherein the seed layer in the conductor layer and via conductor are formed such that the at least one metal in the alloy includes silicon.

12. The wiring substrate according to claim 1, wherein the seed layer in the conductor layer and via conductor are formed such that the at least one metal in the alloy is silicon.

13. The wiring substrate according to claim 12, wherein the seed layer in the conductor layer and via conductor are formed such that a content of silicon in the alloy is in a range of 0.5 at % to 10.0 at %.

14. The wiring substrate according to claim 2, wherein the seed layer in the conductor layer and via conductor are formed such that a content of aluminum in the alloy is in a range of 1.0 at % to 15.0 at %.

15. The wiring substrate according to claim 2, wherein the seed layer in the conductor layer and via conductor are formed such that the alloy includes carbon.

16. The wiring substrate according to claim 15, wherein the seed layer in the conductor layer and via conductor are formed such that a content of carbon in the alloy is 50 ppm or less.

17. The wiring substrate according to claim 2, wherein the seed layer in the conductor layer and via conductor are formed such that the alloy includes oxygen.

18. The wiring substrate according to claim 17, wherein the seed layer in the conductor layer and via conductor are formed such that a content of oxygen in the alloy is 100 ppm or less.

19. The wiring substrate according to claim 2, wherein the core substrate is formed such that the resin insulating layer is formed in contact with a surface of the glass substrate and that no conductor circuit is formed on the surface of the glass substrate.

20. The wiring substrate according to claim 10, wherein the seed layer in the conductor layer and via conductor are formed such that the at least one metal in the alloy is silicon.

* * * * *